(12) United States Patent
Lin et al.

(10) Patent No.: US 10,211,380 B2
(45) Date of Patent: Feb. 19, 2019

(54) LIGHT EMITTING DEVICES AND COMPONENTS HAVING IMPROVED CHEMICAL RESISTANCE AND RELATED METHODS

(75) Inventors: Shaow Lin, Cary, NC (US); James Sievert, Morrisville, NC (US); Jesse Colin Reiherzer, Wake Forest, NC (US); Barry Rayfield, Wake Forest, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 227 days.

(21) Appl. No.: 13/309,177

(22) Filed: Dec. 1, 2011

(65) Prior Publication Data

US 2013/0020590 A1 Jan. 24, 2013

(51) Int. Cl.
*H01L 23/10* (2006.01)
*H01L 23/34* (2006.01)
(Continued)

(52) U.S. Cl.
CPC ............. *H01L 33/60* (2013.01); *H01L 33/44* (2013.01); *H01L 33/62* (2013.01); *H01L 33/647* (2013.01); *H01L 2224/48091* (2013.01); *H01L 2224/48137* (2013.01); *H01L 2224/48247* (2013.01); *H01L 2224/8592* (2013.01); *H01L 2924/181* (2013.01); *Y10T 428/24612* (2015.01); *Y10T 428/265* (2015.01); *Y10T 428/31663* (2015.04); *Y10T 428/31678* (2015.04)

(58) Field of Classification Search
CPC ... H01L 33/36; H01L 33/48; H01L 23/53242; H01L 29/43; H01L 2924/01013; H01L 2924/01028; H01L 2924/01029; H01L 2924/01047; H01L 33/62; H01L 33/647; H01L 23/36–23/3738
USPC .............. 257/88, 98, E33.057; 428/174, 434
See application file for complete search history.

(56) References Cited

U.S. PATENT DOCUMENTS

| 3,288,728 A | 11/1966 | Gorham |
| 3,609,475 A * | 9/1971 | Kaposhilin ............. H01L 33/52 257/100 |

(Continued)

FOREIGN PATENT DOCUMENTS

| CN | 101 047 220 | 10/2007 |
| CN | 101276870 A | 10/2008 |

(Continued)

OTHER PUBLICATIONS

"SCS Parylene Coatings for LEDS," Specialty Coating Systems, 2009, pp. 1-2, Indianapolis, IN, USA.

(Continued)

*Primary Examiner* — Mary Wilczewski
*Assistant Examiner* — Tsz Chiu
(74) *Attorney, Agent, or Firm* — Jenkins, Wilson, Taylor & Hunt, P.A.

(57) ABSTRACT

Light emitting devices and components having excellent chemical resistance and related methods are disclosed. In one embodiment, a component of a light emitting device can include a silver (Ag) portion, which can be silver on a substrate, and a protective layer disposed over the Ag portion. The protective layer can at least partially include an inorganic material for increasing the chemical resistance of the Ag portion.

45 Claims, 8 Drawing Sheets

(51) Int. Cl.
*H01L 33/60* (2010.01)
*H01L 33/62* (2010.01)
*H01L 33/64* (2010.01)
*H01L 33/44* (2010.01)

(56) References Cited

U.S. PATENT DOCUMENTS

| | | | |
|---|---|---|---|
| 3,875,456 A | 4/1975 | Kano et al. | |
| H000445 H | 3/1988 | Bock et al. | |
| 4,918,497 A | 4/1990 | Edmond | |
| 4,946,547 A | 8/1990 | Palmour | |
| 4,966,862 A | 10/1990 | Edmond | |
| 5,027,168 A | 6/1991 | Edmond | |
| 5,200,022 A | 4/1993 | Kong | |
| 5,210,051 A | 5/1993 | Carter, Jr. | |
| 5,338,944 A | 8/1994 | Edmond | |
| 5,359,345 A | 10/1994 | Hunter | |
| RE34,861 E | 2/1995 | Davis | |
| 5,393,993 A | 2/1995 | Edmond | |
| 5,416,342 A | 5/1995 | Edmond | |
| 5,523,589 A | 6/1996 | Edmond | |
| 5,604,135 A | 2/1997 | Edmond | |
| 5,631,190 A | 5/1997 | Negley | |
| 5,739,554 A | 4/1998 | Edmond | |
| 5,912,477 A | 6/1999 | Negley | |
| 5,959,316 A | 9/1999 | Lowery | |
| 6,120,600 A | 9/2000 | Edmond | |
| 6,121,637 A | 9/2000 | Isokawa et al. | |
| 6,187,606 B1 | 2/2001 | Edmond | |
| 6,201,262 B1 | 3/2001 | Edmond | |
| 6,252,254 B1 | 6/2001 | Soules et al. | |
| 6,350,041 B1 | 2/2002 | Tarsa et al. | |
| 6,514,782 B1* | 2/2003 | Wierer, Jr. | H01L 25/0753 257/13 |
| 6,576,930 B2 | 6/2003 | Reeh et al. | |
| 6,600,175 B1 | 7/2003 | Baretz | |
| 6,717,353 B1 | 4/2004 | Mueller et al. | |
| 6,791,119 B2 | 9/2004 | Slater, Jr. | |
| 6,853,010 B2 | 2/2005 | Slater, Jr. | |
| 6,860,621 B2 | 3/2005 | Bachl et al. | |
| 6,936,857 B2 | 8/2005 | Doxsee et al. | |
| 6,958,497 B2 | 10/2005 | Emerson | |
| 7,005,679 B2 | 2/2006 | Tarsa et al. | |
| 7,087,936 B2 | 8/2006 | Negley | |
| 7,095,056 B2 | 8/2006 | Vitta | |
| 7,183,577 B2 | 2/2007 | Mueller-Mach | |
| 7,211,835 B2 | 5/2007 | Ono | |
| 7,213,940 B1 | 5/2007 | Van De Ven | |
| 7,244,965 B2 | 7/2007 | Andrews et al. | |
| 7,246,930 B2 | 7/2007 | Yatsuda et al. | |
| 7,250,715 B2 | 7/2007 | Mueller et al. | |
| 7,304,326 B2 | 12/2007 | Suehiro et al. | |
| 7,344,902 B2 | 3/2008 | Basin et al. | |
| 7,456,499 B2 | 11/2008 | Loh | |
| 7,476,909 B2 | 1/2009 | Nagai et al. | |
| 7,534,635 B1 | 5/2009 | Foust et al. | |
| 7,564,180 B2 | 7/2009 | Brandes | |
| 7,598,669 B2 | 10/2009 | Toguchi et al. | |
| 7,638,811 B2 | 12/2009 | Slater | |
| 7,655,957 B2 | 2/2010 | Loh | |
| 7,709,853 B2 | 5/2010 | Medendorp | |
| 7,791,061 B2 | 9/2010 | Edmond et al. | |
| 7,821,023 B2 | 10/2010 | Yuan et al. | |
| 7,825,575 B2 | 11/2010 | Sawanobori et al. | |
| 7,833,073 B2 | 11/2010 | Ogawa | |
| 7,842,526 B2 | 11/2010 | Hadame et al. | |
| 7,868,343 B2 | 1/2011 | Negley | |
| 7,948,076 B2* | 5/2011 | Wang | H01L 23/3677 257/707 |
| 7,952,115 B2 | 5/2011 | Loh | |
| 8,011,818 B2 | 9/2011 | Negley | |
| 8,052,307 B2 | 11/2011 | Bak et al. | |
| 8,058,088 B2 | 11/2011 | Cannon | |
| 8,378,379 B2 | 2/2013 | Tanida et al. | |
| 8,398,892 B2* | 3/2013 | Shioi | C09K 11/0883 252/301.4 F |
| 8,858,022 B2* | 10/2014 | Jiang et al. | 362/235 |
| 8,946,747 B2 | 2/2015 | Reiherzer | |
| 8,957,580 B2 | 2/2015 | Reiherzer | |
| 9,055,700 B2 | 6/2015 | Humphries et al. | |
| 9,240,530 B2 | 1/2016 | Reiherzer | |
| 9,343,441 B2 | 5/2016 | Reiherzer | |
| 9,496,466 B2 | 11/2016 | Hussell et al. | |
| 10,008,637 B2 | 6/2018 | Britt et al. | |
| 2002/0004577 A1* | 1/2002 | Biebuyck et al. | 528/12 |
| 2002/0163006 A1* | 11/2002 | Yoganandan | H01L 33/486 257/81 |
| 2003/0067761 A1 | 4/2003 | Horiuchi et al. | |
| 2004/0069993 A1 | 4/2004 | Murano | |
| 2004/0079957 A1 | 4/2004 | Andrews et al. | |
| 2004/0252501 A1* | 12/2004 | Moriyama | F21K 9/17 362/238 |
| 2005/0007783 A1 | 1/2005 | Ono | |
| 2005/0045898 A1 | 3/2005 | Leu et al. | |
| 2005/0093430 A1 | 5/2005 | Ibbetson et al. | |
| 2005/0159581 A1 | 7/2005 | Vanderzande et al. | |
| 2005/0194609 A1 | 9/2005 | Furukawa | |
| 2005/0224830 A1* | 10/2005 | Blonder et al. | 257/100 |
| 2006/0091415 A1* | 5/2006 | Yan | 257/99 |
| 2006/0091788 A1 | 5/2006 | Yan | |
| 2006/0099449 A1 | 5/2006 | Amano et al. | |
| 2006/0105484 A1 | 5/2006 | Basin | |
| 2006/0113906 A1 | 6/2006 | Ogawa | |
| 2006/0124953 A1 | 6/2006 | Negley et al. | |
| 2006/0138621 A1 | 6/2006 | Bogner | |
| 2006/0145172 A1 | 7/2006 | Se et al. | |
| 2006/0163589 A1* | 7/2006 | Fan et al. | 257/88 |
| 2006/0181866 A1 | 8/2006 | Jung et al. | |
| 2006/0186418 A1 | 8/2006 | Edmond | |
| 2006/0221272 A1 | 10/2006 | Negley | |
| 2006/0226759 A1 | 10/2006 | Masuda et al. | |
| 2007/0012940 A1 | 1/2007 | Suh et al. | |
| 2007/0090383 A1 | 4/2007 | Ota et al. | |
| 2007/0139923 A1 | 6/2007 | Negley | |
| 2007/0158668 A1 | 7/2007 | Tarsa | |
| 2007/0170447 A1 | 7/2007 | Negley | |
| 2007/0182323 A1 | 8/2007 | Ogata et al. | |
| 2007/0223219 A1 | 9/2007 | Medendorp et al. | |
| 2007/0228387 A1 | 10/2007 | Negley et al. | |
| 2007/0253209 A1 | 11/2007 | Loh | |
| 2007/0268694 A1* | 11/2007 | Bailey et al. | 362/231 |
| 2008/0012036 A1 | 1/2008 | Loh | |
| 2008/0080165 A1 | 4/2008 | Kim et al. | |
| 2008/0081065 A1 | 4/2008 | Bulavin | |
| 2008/0121921 A1 | 5/2008 | Loh | |
| 2008/0169758 A1 | 7/2008 | Cok | |
| 2008/0173884 A1 | 7/2008 | Chitnis | |
| 2008/0179611 A1 | 7/2008 | Chitnis | |
| 2008/0179617 A1 | 7/2008 | Kadotani | |
| 2008/0198112 A1 | 8/2008 | Roberts | |
| 2008/0237616 A1 | 10/2008 | Hatakoshi et al. | |
| 2008/0239724 A1 | 10/2008 | Moriyama et al. | |
| 2008/0258130 A1 | 10/2008 | Bergmann | |
| 2008/0303052 A1 | 12/2008 | Lee et al. | |
| 2008/0308825 A1 | 12/2008 | Chakraborty | |
| 2009/0039375 A1 | 2/2009 | LeToquin | |
| 2009/0050907 A1* | 2/2009 | Yuan et al. | 257/88 |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 | 3/2009 | McMillan | |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 | 8/2009 | Braune et al. | |
| 2009/0231833 A1 | 9/2009 | Miki et al. | |
| 2009/0236621 A1 | 9/2009 | Chakraborty | |
| 2009/0236759 A1* | 9/2009 | Kashiwagi | C08L 83/04 257/791 |
| 2009/0250714 A1 | 10/2009 | Yun et al. | |
| 2009/0261374 A1 | 10/2009 | Hayashi | |
| 2009/0283779 A1* | 11/2009 | Negley et al. | 257/88 |

(56) References Cited

U.S. PATENT DOCUMENTS

| | | | |
|---|---|---|---|
| 2009/0295265 A1* | 12/2009 | Tabuchi | H01L 33/56 313/112 |
| 2009/0309116 A1 | 12/2009 | Kato et al. | |
| 2009/0315057 A1 | 12/2009 | Konishi et al. | |
| 2010/0025699 A1 | 2/2010 | Liu | |
| 2010/0025709 A1 | 2/2010 | Koseki et al. | |
| 2010/0090244 A1 | 4/2010 | Ohba | |
| 2010/0102344 A1 | 4/2010 | Ueji | |
| 2010/0103660 A1* | 4/2010 | van de Ven et al. | 362/231 |
| 2010/0133556 A1 | 6/2010 | Li et al. | |
| 2010/0155763 A1 | 6/2010 | Donofrio | |
| 2010/0200874 A1 | 8/2010 | Shioi et al. | |
| 2010/0203657 A1 | 8/2010 | Kim | |
| 2010/0208487 A1 | 8/2010 | Li | |
| 2010/0213502 A1* | 8/2010 | Kashiwagi et al. | 257/100 |
| 2010/0226130 A1 | 9/2010 | Cheng et al. | |
| 2010/0237375 A1 | 9/2010 | Yamazaki et al. | |
| 2010/0252851 A1 | 10/2010 | Emerson et al. | |
| 2010/0258830 A1 | 10/2010 | Ide et al. | |
| 2010/0283381 A1 | 11/2010 | Takahashi et al. | |
| 2010/0289395 A1 | 11/2010 | Sun et al. | |
| 2011/0001148 A1 | 1/2011 | Sun et al. | |
| 2011/0031513 A1 | 2/2011 | Hsieh et al. | |
| 2011/0046319 A1 | 2/2011 | Ueno et al. | |
| 2011/0108875 A1 | 5/2011 | Takenaka et al. | |
| 2011/0204398 A1* | 8/2011 | Tanida | H01L 33/486 257/98 |
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0241049 A1 | 10/2011 | Tanida et al. | |
| 2011/0242806 A1 | 10/2011 | Ramer et al. | |
| 2011/0248289 A1 | 10/2011 | Hsieh et al. | |
| 2011/0253429 A1 | 10/2011 | Humphries et al. | |
| 2011/0272721 A1 | 11/2011 | Butterworth | |
| 2011/0278618 A1 | 11/2011 | Nakayama | |
| 2011/0284897 A1 | 11/2011 | Takayama | |
| 2012/0007119 A1 | 1/2012 | Shiobara et al. | |
| 2012/0126257 A1* | 5/2012 | Reiherzer et al. | 257/88 |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1 | 1/2013 | Lin et al. | |
| 2013/0141905 A1 | 6/2013 | Hussell | |
| 2013/0141920 A1 | 6/2013 | Emerson | |
| 2013/0161650 A1 | 6/2013 | Lin | |
| 2013/0168719 A1 | 7/2013 | Watkins et al. | |
| 2013/0207130 A1 | 8/2013 | Reiherzer | |
| 2013/0207141 A1 | 8/2013 | Reiherzer | |
| 2013/0207142 A1 | 8/2013 | Reiherzer | |
| 2013/0208442 A1 | 8/2013 | Reiherzer | |
| 2013/0214298 A1 | 8/2013 | Lin et al. | |

FOREIGN PATENT DOCUMENTS

| | | |
|---|---|---|
| CN | 101438424 A | 5/2009 |
| CN | 101 814 571 A | 8/2010 |
| CN | 102150480 | 8/2011 |
| CN | 102163680 | 8/2011 |
| CN | 201918428 | 8/2011 |
| CN | 102214775 | 10/2011 |
| CN | 102214776 A | 10/2011 |
| CN | 103782402 | 5/2014 |
| CN | 104247055 | 12/2014 |
| CN | 104247060 | 12/2014 |
| CN | 103988324 B | 3/2017 |
| CN | 104115293 B | 7/2018 |
| EP | 1536487 | 6/2005 |
| EP | 2056363 A2 | 5/2009 |
| EP | 2365549 A1 | 9/2011 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-206015 A | 9/2010 |
| JP | 2010-226093 A | 10/2010 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A | 9/2004 |
| WO | WO 2009-107052 | 9/2009 |
| WO | WO 2010-1113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/0101385 | 7/2013 |

OTHER PUBLICATIONS

"SCS Electronic Coatings," Specialty Coating Systems, 2010, pp. 1-4, Indianapolis, IN, USA.

Restriction Requirement for U.S. Appl. No. 13/372,076 dated Jan. 31, 2013.

International Search Report and Written Opinion for Application No. PCT/US2012/047608 dated Jan. 31, 2013.

International Search Report and Written Opinion for Application No. PCT/US2012/067323 dated Mar. 15, 2013.

International Search Report and Written Opinion for Application No. PCT/US2012/067326 dated Mar. 15, 2013.

International Search Report and Written Opinion for Application No. PCT/US2012/067055 dated Mar. 28, 2013.

International Search Report and Written Opinion for Application No. PCT/US2012/067058 dated Mar. 29, 2013.

Non-Final Office Action for U.S. Appl. No. 13/372,076 dated Aug. 8, 2013.

Non-Final Office Action for U.S. Appl. No. 13/554,769 dated Oct. 9, 2013.

U.S. Appl. No. 13/372,063 dated Feb. 13, 2012.
U.S. Appl. No. 13/444,394 dated Apr. 11, 2012.
U.S. Appl. No. 13/444,399 dated Apr. 11, 2012.
U.S. Appl. No. 13/372,076 dated Feb. 13, 2012.
U.S. Appl. No. 13/554,769 dated Jul. 20, 2012.
U.S. Appl. No. 13/312,508 dated Dec. 6, 2011.
U.S. Appl. No. 13/312,518 dated Dec. 6, 2011.
U.S. Appl. No. 12/757,891 dated Apr. 9, 2010.

Ming Ma, et al., Effects of the refractive index of the encapsulant on the light-extraction efficiency of light-emitting diodes, Optics Express, Sep. 12, 2011, pp. A1135-A1140, vol. 1 , No. S5.

Non-Final Office Action for U.S. Appl. No. 13/312,508 dated Dec. 17, 2013.

Non-Final Office Action for U.S. Appl. No. 13/372,076 dated Mar. 18, 2014.

Non-Final Office Action for U.S. Appl. No. 13/312,518 dated Jul. 17, 2014.

Non-Final Office Action for U.S. Appl. No. 13/444,394 dated Jul. 22, 2014.

(56) References Cited

OTHER PUBLICATIONS

Non-Final Office Action for U.S. Appl. No. 13/372,063 dated Jul. 28, 2014.
Final Office Action for U.S. Appl. No. 13/312,508 dated Aug. 20, 2014.
Non-Final Office Action for U.S. Appl. No. 13/312,518 dated Feb. 28, 2014.
Non-Final Office Action for U.S. Appl. No. 13/554,769 dated Mar. 18, 2014.
Restriction Requirement for U.S. Appl. No. 13/372,063 dated Apr. 10, 2014.
Restriction Requirement for U.S. Appl. No. 13/691,102 dated Apr. 11, 2014.
Restriction Requirement for U.S. Appl. No. 13/691,102 dated Oct. 3, 2014.
Final Office Action for U.S. Appl. No. 13/554,769 dated Oct. 16, 2014.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Final Office Action for U.S. Appl. No. 13/312,518 dated Nov. 24, 2014.
Non-Final Office Action for U.S. Appl. No. 13/444,399 dated Nov. 14, 2014.
Japanese Office Action for Application No. 2014/521828 dated Jan. 6, 2015.
Final Office Action for U.S. Appl. No. 13/444,394 dated Jan. 23, 2015.
Taiwanese Office Action for Application No. 101126247 dated Dec. 19, 2014.
Non-Final Office Action for U.S. Appl. No. 13/312,518 dated Mar. 13, 2015.
Narukawa et al. "White light emitting diodes with super-high luminous efficacy", Journal Of Physics D, 43 (2010) 354002.
Advisory Action for U.S. Appl. No. 13/554,769 dated Jan. 5, 2015.
Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/691,102 dated Apr. 24, 2015.
Non-Final Office Action for U.S. Appl. No. 13/554,769 dated Apr. 27, 2015.
Final Office Action for U.S. Appl. No. 13/444,399 dated Apr. 28, 2015.
Japanese Office Action for Application No. 2014-545949 dated May 19, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,508 dated Jul. 22, 2015.
Notice of Allowance for U.S. Appl. No. 13/372,076 dated Oct. 7, 2014.
Notice of Allowance for U.S. Appl. No. 13/372,063 dated Oct. 8, 2014.
Notice of Allowance for U.S. Appl. No. 13/372,063 dated Jan. 22, 2015.
Final Office Action for U.S. Appl. No. 13/312,518 dated Aug. 4, 2015.
Non-Final Office Action for U.S. Appl. No. 13/444,399 dated Aug. 27, 2015.
Notice of Allowance for U.S. Appl. No. 13/444,394 dated Sep. 11, 2015.
Non-Final Office Action for U.S. Appl. No. 13/312,508 dated Nov. 17, 2015.
Non-Final Office Action for U.S. Appl. No. 13/312,518 dated Dec. 3, 2015.
Final Office Action for U.S. Appl. No. 13/554,769 dated Dec. 4, 2015.
Notice of Allowance for U.S. Appl. No. 13/444,399 dated Jan. 15, 2016.
First Chinese Office Action for Application No. 2012 800 440 227 dated Jan. 15, 2016.
Chinese Office Action for Application No. 2012 800604373 dated Feb. 15, 2016.
Final Office Action for U.S. Appl. No. 13/691,102 dated Feb. 25, 2016.
Advisory Action for U.S. Appl. No. 13/554,769 dated Mar. 24, 2016.
Chinese Office Action for Application No. 2012 800 690 449 dated Apr. 6, 2016.
Advisory Action for U.S. Appl. No. 13/691,102 dated May 20, 2016.
Final Office Action for U.S. Appl. No. 13/312,518 dated Jun. 1, 2016.
Non-Final Office Action for U.S. Appl. No. 13/554,769 dated Jun. 10, 2016.
Examiner-Initiated Interview Summary for U.S. Appl. No. 13/312,508 dated Jul. 1, 2016.
Notice of Allowance for U.S. Appl. No. 13/312,508 dated Jul. 1, 2016.
Non-Final Office Action for U.S. Appl. No. 13/691,102 dated Aug. 5, 2016.
Chinese Office Action for Application No. 2012800440227 dated Aug. 9, 2016.
Chinese Office Action for Application No. 2012800440227 dated Feb. 24, 2017.
Chinese Office Action for Application No. 2012800690449 dated Nov. 16, 2016.
Non-Final Office Action for U.S. Appl. No. 13/312,518 dated Nov. 30, 2016.
Final Office Action for U.S. Appl. No. 13/309,177 dated Dec. 21, 2016.
Non-Final Office Action for U.S. Appl. No. 13/554,769 dated Jan. 18, 2017.
Final Office Action for U.S. Appl. No. 13/691,102 dated Feb. 10, 2017.
Final Office Action for U.S. Appl. No. 13/554,769 dated Aug. 9, 2017.
Notice of Allowance with Interview Summary for U.S. Appl. No. 13/312,518 dated Sep. 18, 2017.
Chinese Office Action for Application No. 2012800690449 dated May 27, 2017.
Chinese Notice of Allowance for Chinese Application No. 201280044022.7 dated Sep. 27, 2017.
Non-Final Office Action for U.S. Appl. No. 13/691,102 dated Oct. 4, 2017.
Advisory Action for U.S. Appl. No. 13/554,769 dated Oct. 13, 2017.
Chinese Office Action for Chinese Application No. 201280069044.9 dated Jan. 2, 2018.
Non-Final Office Action for U.S. Appl. No. 13/544,769 dated Mar. 7, 2018.
Final Office Action for U.S. Appl. No. 13/691,102 dated Apr. 6, 2018.
Applicant Initiated Interview Summary for U.S. Appl. No. 13/691,102 dated Jun. 7, 2018.
Notice of Allowance for U.S. Appl. No. 13/554,769 dated Jul. 26, 2018.

* cited by examiner

LIGHT EMITTING DEVICES AND COMPONENTS HAVING IMPROVED CHEMICAL RESISTANCE AND RELATED METHODS

CROSS REFERENCE TO RELATED APPLICATION

This application relates and claims priority to U.S. Provisional Patent Application Ser. No. 61/510,310, filed Jul. 21, 2011, the disclosure of which is hereby incorporated by reference its entirety.

TECHNICAL FIELD

The subject matter herein relates generally to light emitting devices, components and methods. More particularly, the subject matter herein relates to light emitting devices, components and methods with improved resistance to chemicals and/or chemical vapors or gases that can adversely affect the brightness and reliability of such devices.

BACKGROUND

Light emitting diodes (LEDs), can be utilized in light emitting devices or packages for providing white light (e.g., perceived as being white or near-white), and are developing as replacements for incandescent, fluorescent, and metal halide high-intensity discharge (HID) light products. Conventional LED devices or packages can incorporate components such as metallic traces or mounting surfaces which can become tarnished, corroded, or otherwise degraded when exposed to various undesirable chemicals and/or chemical vapors. Such chemicals and/or chemical vapors can enter conventional LED devices, for example, by permeating an encapsulant filling material disposed over such components. In one aspect, undesirable chemicals and/or chemical vapors can contain sulfur, sulfur-containing compounds (e.g., sulfides, sulfites, sulfates, $SO_x$), chlorine and bromine containing complexes, nitric oxide or nitrogen dioxides (e.g., $NO_x$), and oxidizing organic vapor compounds which can permeate the encapsulant and physically degrade various components within the LED device via corroding, oxidizing, darkening, and/or tarnishing such components. Such degradation can adversely affect brightness, reliability, and/or thermal properties of conventional LED devices over time, and can further adversely affect the performance of the devices during operation.

Despite the availability of various light emitting devices in the marketplace, a need remains for devices and components having improved chemical resistance and related methods for preventing undesirable chemicals and/or chemical vapors from reaching and subsequently degrading components within the devices. Devices, components, and methods described herein can advantageously improve chemical resistance to undesirable chemicals and/or chemical vapors within encapsulated LED devices, while promoting ease of manufacture and increasing device reliability and performance in high power and/or high brightness applications. Described methods can be used and applied to create chemically resistant surface mount device (SMD) type of LED devices of any size, thickness, and/or dimension. Devices, components, and methods described herein can advantageously be used and adapted within any style of LED device, for example, devices including a single LED chip, multiple chips, and/or multi-arrays of LEDs and/or devices incorporating different materials for the body or submount such as plastic, ceramic, glass, aluminum nitride (AlN), aluminum oxide ($Al_2O_3$), printed circuit board (PCB), metal core printed circuit board (MCPCB), and aluminum panel based devices. Notably, devices, components, and methods herein can prevent degradation of optical and/or thermal properties of devices or packages incorporating silver (Ag) or Ag plated components by preventing tarnishing of the Ag or Ag-plated components.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
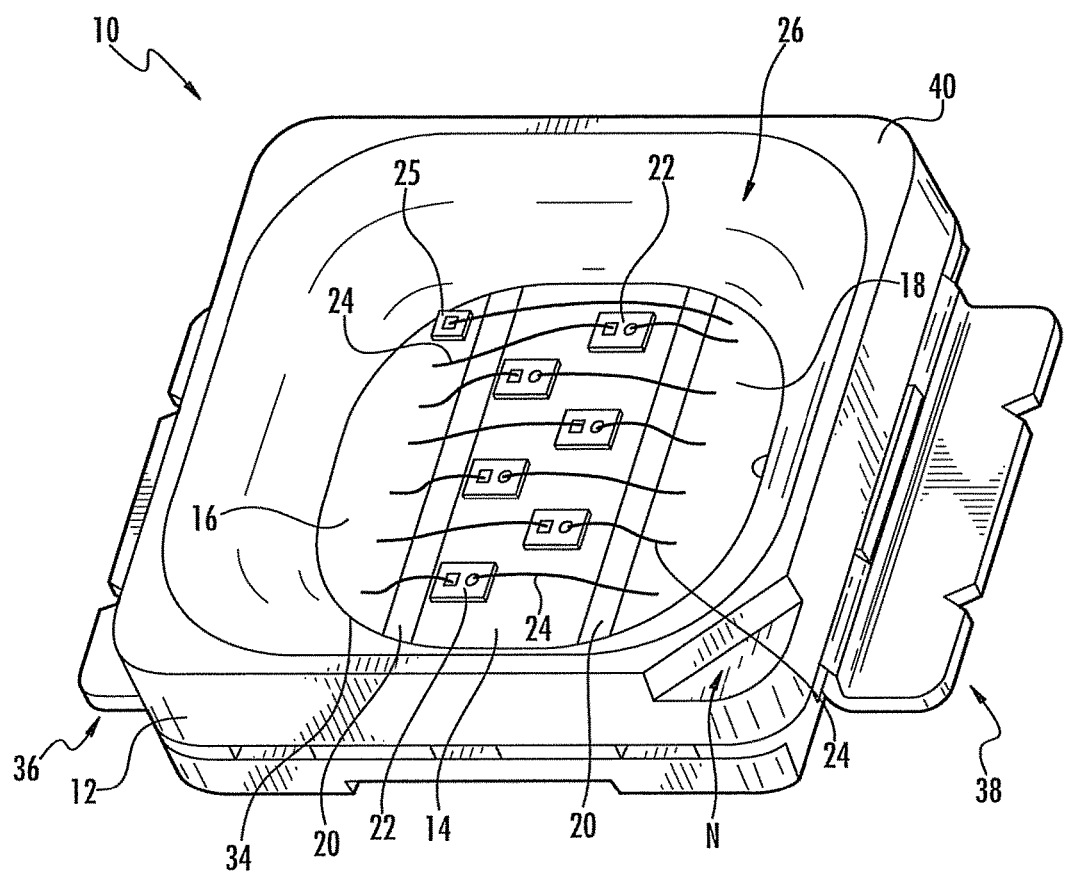
FIG. 1 is a top perspective view of a first embodiment of a light emitting diode (LED) device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitting devices according to embodiments described herein can comprise group III-V nitride (e.g., gallium nitride (GaN)) based light emitting diodes (LEDs) or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown can be removed, and the freestanding epitaxial layers can be mounted on a substitute carrier substrate or substrate which can have different thermal, electrical, structural and/ or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs according to some embodiments of the present subject matter, for example, can be fabricated on growth substrates (e.g., Si, SiC, or sapphire substrates) to provide horizontal devices (with at least two electrical contacts on a same side of the LED) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED and/or to reduce a forward voltage through a vertical LED. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LEDS can be at least partially coated with one or more phosphors. The phosphors can absorb a portion of the LED light and emit a different wavelength of light such that the LED device or package emits a combination of light from each of the LED and the phosphor. In one embodiment, the LED device or package emits what is perceived as white light resulting from a combination of light emission from the LED chip and the phosphor. One or more LEDs can be coated and fabricated using many different methods, with one suitable method being described in U.S. patent application Ser. Nos. 11/656, 759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473, 089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which can be white emitting.

Referring now to FIGS. 1 to 13, FIGS. 1 and 2 illustrate top and cross-sectional views of one example of a light emitting diode (LED) package or device, generally designated 10. In one aspect, LED device 10 can comprise a surface mount device (SMD) comprising a body 12 which can be molded or otherwise formed about a leadframe. SMD types of LED devices can be suitable for general LED illumination applications, such as indoor and outdoor lighting, automotive lighting, and preferably suitable for high power and/or high brightness lighting applications. The subject matter disclosed herein can be suitably adapted for application within a wide range of SMD type LED device designs, not limited to dimensional and/or material variations. Notably, devices, components, and methods disclosed herein can maintain the brightness of device 10 even in the presence of harmful chemicals, chemical vapors, or complexes by provision of a protective barrier or protective layer P (FIG. 2) adapted to prevent harmful chemicals or complexes from tarnishing and/or otherwise degrading components within device 10. In one aspect, body 12 can be disposed about a leadframe comprising a thermal element 14 and one or more electrical elements, for example, first and second electrical elements 16 and 18, respectively. That is, thermal element 14 and electrical elements 16 and 18 can be collectively referred to as a "leadframe" and can be singulated from a sheet of leadframe components (not shown). A corner notch, generally designated N can be used for indicating electrical polarity of first and second electrical elements 16 and 18. Thermal element 14 and first and second electrical elements 16 and 18 can comprise a material that is electrically and/or thermally conductive such as a metal or metal alloy. In one aspect, thermal element 14 can be electrically and/or thermally isolated one and/or both of first and second electrical elements 16 and 18 by one or more isolating portions 20 of the body. One or more LED chips or LEDs 22 can be mounted over thermal element 14 using any suitable die attach technique(s) and/or material(s), for example only and not limited to die attach adhesive (e.g., silicone, epoxy, or conductive silver (Ag) epoxy) or a metal-to-metal die attach technique such as flux or no-flux eutectic, non-eutectic, or thermal compression die attach.

LEDs 22 can electrically communicate with one and/or both first and second electrical elements 16 and 18 via one or more electrical connectors such as electrically conductive wire bonds 24. For illustration purposes, LEDs 22 with two electrical contacts on the same side (e.g., upper surface) are shown as electrically connected to two electrical elements (e.g., 16 and 18) via wire bonds 24. However, LEDs 22 having one electrical contact on the upper surface that is electrically connected with a single electrical element is also contemplated. Any type or style of LED 22 can be used in device 10, for example, LED 22 can comprise a horizontally structured chip (e.g., having at least two electrical contacts on a same side of the LED) or a vertically structured chip (e.g., with electrical contacts on opposing sides of the LED) with or without a growth substrate. LED 22 can comprise one or more substantially straight cut and/or beveled (i.e., angled) cut sides or surfaces. LED 22 can comprise a direct attach build (e.g., bonded to a carrier substrate) or a build incorporating a grown substrate such as sapphire, SiC, or GaN. LEDs 22 having any build, structure, type, style, shape, and/or dimension are contemplated herein. Wire bonds 24 or other electrical attachment connectors and related methods can be adapted to communicate, transmit, or convey an electrical current or signal from electrical elements 16 and 18 to one or more LEDs 22 thereby causing illumination of the one or more LEDs 22. Thermal element 14 and/or first and second electrical elements 16 and 18, respectively, can be coated, plated, deposited, or otherwise layered with a reflective material (FIG. 2), such as, for example and without limitation, Ag or a Ag-containing alloy for reflecting light from the one or more LEDs 22.

Body 12 can comprise any suitable material molded or otherwise disposed about thermal element 14 and/or first and second elements 16 and 18, respectively. In one aspect, body 12 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, body 12 can comprise a molded plastic material such as polyamide (PA), polyphthalamide (PPA), liquid crystal polymer (LCP) or silicone. At least one electrostatic discharge (ESD) protection device 25 can be disposed within device 10 and can be electrically connected to electrical elements 16 and 18 reverse biased with respect to LEDs 22. ESD device 25 can protect against damage from ESD within device 10. In one aspect, different elements can be used as ESD protection devices 25 such as various vertical silicon (Si) Zener diodes, different LEDs arranged reverse biased to LEDs 22, surface mount varistors and lateral Si diodes. As illustrated, ESD device 25 can comprise a vertically structured device having one electrical contact on the bottom and another electrical contact on the top; however, horizontally structured devices are also contemplated.

Figure 2:
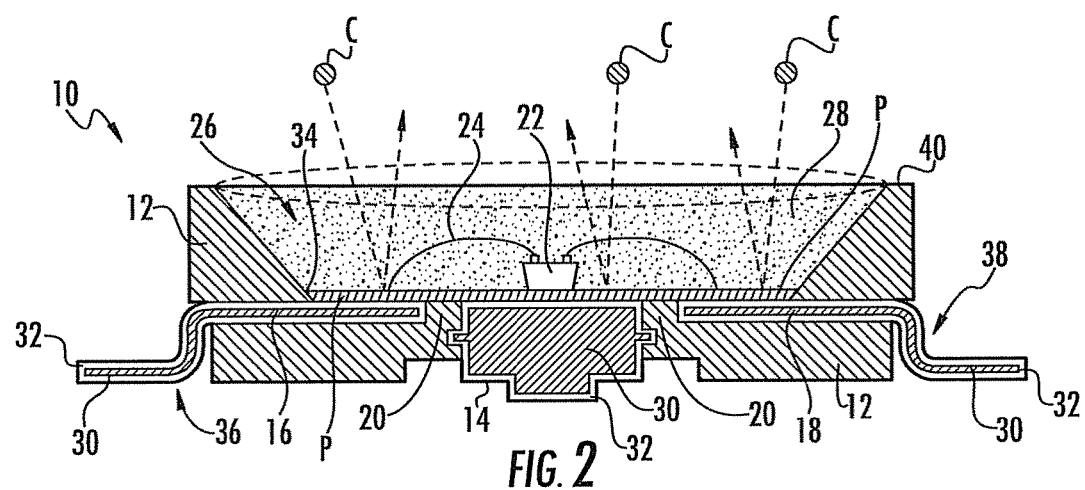
FIG. 2 is a cross-sectional view of the first embodiment of the LED device according to the disclosure herein.

Still referring to FIGS. 1 and 2, body 12 of device 10 can comprise a cavity, generally designated 26, for example, a reflector cavity optionally coated with a reflective material for reflecting light from the one or more LEDs 22. As FIG. 2 illustrates, cavity 26 can be filled at least partially or completely with a filling material, such as an encapsulant 28. Encapsulant can optionally comprise one or more phosphor materials adapted to emit light of a desired wavelength when activated by light emitted from the one or more LEDs 22. Thus, in one aspect, device 10 can emit light having a desired wavelength or color point that can be a combination of light emitted from phosphors disposed in encapsulant 28 and from the light emitted from one or more LEDs 22. In one aspect, thermal element 14 and first and second electrical elements 16 and 18 can comprise an inner portion 30 and an outer portion 32. In one aspect, inner portion 30 and outer portion 32 can comprise electrically and/or thermally conductive materials. Outer portion 32 may be applied such that it entirely surrounds inner portion 30 as shown, or in other aspects outer portion 32 can optionally plate, coat, or comprise a layer over a single surface or two or more surfaces of portion 30.

In one aspect, outer portion 32 can comprise a highly reflective Ag substrate, substrate containing Ag, or layer of material such as Ag for maximizing light output from device 10 and for assisting in heat dissipation by conducting heat away from the one or more LEDs 22. Outer portion 32 can also comprise a substrate of Ag-containing alloy instead of pure Ag, and such alloy can contain other metals such as titanium (Ti) or nickel (Ni). Inner portion 30 can comprise a metal or metal alloy such as copper (Cu) substrate or Cu-alloy substrate. In one aspect, an optional layer of material (not shown) can be disposed between inner portion 30 and outer portion 32, such as a layer of Ni for providing a barrier between the Ag and Cu, thereby preventing defects caused by migratory Cu atoms, such as a defect commonly known as "red plague". In other aspects, outer portion 32 can be directly attached to and/or directly coat inner portion 30. Outer portion 32 can advantageously reflect light emitted from the one or more LEDs 22 thereby improving optical performance of device 10. Upper surfaces of thermal element 14 and electrical elements 16 and 18 can be disposed along a floor 34 of cavity 26 such that respective upper surfaces of thermal and electrical elements are disposed along the same plane and/or different planes. First and second electrical elements 16 and 18 can extend from one or more lateral sides of body 12 and form one or more external tab portions, generally designated 36 and 38. Tab portions 36 and 38 can bend to form one or more lower mounting surfaces such that device 10 can be mounted to an underlying substrate. Tab portions 36 and 38 can outwardly bend away from each other or inwardly bend towards each other thereby adapting either a J-bend or gull-wing orientation as known in the art. However, any configuration of external tabs 36 and 38 is contemplated.

Referring to FIG. 2, a filling material can be disposed and filled to any level within cavity 26 and may be partially disposed below and/or above a top surface 40 of device 10. In one aspect, filling material can comprise an encapsulant 28 that it is filled to a level flush with top surface 40 of device as shown. In other aspects, encapsulant 28 can be filled such that it forms a concave or convex surface with respect to top surface 40 of device 10 as indicated by the dotted lines. In one aspect, encapsulant 28 can be adapted for dispensing within cavity 26. Encapsulant 28 can comprise a selective amount of one or more phosphors adapted to emit light or combinations of light providing device 10 having a desired color point or color temperature. In one aspect, encapsulant 28 can comprise a silicone material, such as a methyl or phenyl silicone encapsulant.

Typically, SMD type devices, such as device 10, do not have secondary optics (e.g., a secondary lens) for preventing harmful chemicals or complexes from permeating the device and thereby degrading Ag or Ag-alloyed outer portions 32 of thermal and/or electrical elements. In some aspects, encapsulant 28 can provide physical protection against foreign solids and liquids, but may not provide adequate protection against gaseous chemicals or airborne elements such as sulfur, oxygen, or moisture which can tarnish or otherwise degrade outer portion 32 where outer portion comprises Ag (e.g., pure Ag, Ag-alloys or Ag plating). In some aspects, Ag-containing components such as outer portion 32 of thermal and electrical elements 14, 16, and 18 can over time become tarnished, corroded, or otherwise degraded where the device 10 has poor chemical resistance. This can decrease the brightness of device 10. In one aspect, undesirable chemicals, vapors, or complexes C can permeate encapsulant 28 and potentially interact with outer portion 32 of elements, for example, by tarnishing such elements thereby resulting in degradation to optical, physical, electrical, and/or thermal properties such as a loss in brightness output and the noticeable darkening of surfaces along cavity floor 34. In this embodiment, undesirable chemical vapors or complexes C can permeate the encapsulant 28 as indicated by the dotted trajectory lines shown in FIG. 2 and could potentially adversely affect outer portion 32 if not deflected from surfaces within the device as shown. Notably, the current subject matter optimizes the chemical resistance of device 10 by incorporating a protective layer P serving as a protective barrier or barrier layer disposed over one or more surfaces of device 10, within device 10, and/or over components of device 10 to prevent complexes C from reaching, interacting with, and/or adversely affecting components such as Ag-containing outer portion 32 of thermal and electrical elements 14, 16, and 18.

As FIG. 2 illustrates, and in one aspect, protective layer P can be directly disposed over outer portion 32 of elements as shown along cavity floor 34. Protective layer P can be applied before attaching the one or more LEDs 22 to thermal element 14 such that protective layer P can be disposed between LED 22 and outer portion 32 of thermal/electrical components or elements. Protective layer P can be used either alone or in combination with a phenyl silicone encapsulant for improving the chemical resistance of LED devices as described herein. FIGS. 4 to 13 illustrate various other alternative locations of protective layer P for providing protection against chemical complexes C within LED devices or packages. In one aspect, undesired chemicals, vapors, or complexes C can comprise chemical vapors containing sulfur, sulfur containing compounds (sulfides, sulfites, sulfates, $SO_x$), chlorine or bromine containing complexes, nitric oxide or nitrogen dioxide ($NO_x$), and/or oxidizing organic vapor compounds. Complexes C can degrade the Ag components (e.g., outer portion 32 of thermal/electrical elements) and result in a loss of brightness output and noticeable darkening of surfaces within the device. The current subject matter can optimize the chemical resistance of device 10 and components within device 10 such that harmful vapors, chemicals, or complexes C cannot reach Ag-containing components (e.g., outer portion 32) as illustrated by the dotted trajectory of complexes C being repelled from the surface of protective layer P, thereby minimizing the damage to reflective Ag components, and further minimizing and/or totally preventing any loss in brightness from device 10 and/or darkening of components within device 10.

Protective layer P can be directly and/or indirectly disposed over vulnerable components within devices described herein, such as located directly or indirectly over Ag or Ag-alloy containing components. Protective layer P can be adapted for application to a variety of surfaces of components within LED devices which is advantageous. In one aspect, protective layer P can be directly applied to portions of surfaces of Ag or Ag-alloy containing components (e.g., outer portions 32 of thermal element 14 and electrical elements 16, 18) alone and/or layer P can be applied to portions of surfaces of LED chips 22 including underfills, on or over wires, wire bonds 24, wire bond balls (e.g., ball formed where wire 24 attaches to LED chip 22), and on surfaces of the LED housing or body all of which, when comprising a portion or layer of Ag over the surface, can comprise Ag-containing components. Protective layer P can be applied over portions of a ceramic or plastic body of LED device, for example, isolating portions 20 of body 12 (FIG. 2). Notably, protective layer P can be selectively applied at or parallel to any number of processing steps within the manufacturing process (e.g., before/after die attachment of LED, before/during/after encapsulation, see FIGS. 4 to 13) for providing broad protection against chemical vapors, such as but not limited to, nitric oxide or nitrogen dioxide ($NO_x$), oxidizing organic vapor compounds, sulfur, sulfur-containing compounds (e.g., sulfides, sulfates, $SO_x$) and chlorine- or bromine-containing complexes. Notably, when a protective layer P is incorporated, devices described herein can exhibit excellent chemical, including sulfur, resistance and long lasting protection against chemical complexes C as compared to conventional devices. In one aspect, improved devices, such as device 10, can retain approximately 95% or more of its initial brightness value (e.g., measured in lumens) when exposed to a sulfur environment as compared to conventional devices which may only retain approximately 60% of its initial brightness value when exposed to the same sulfur environment. Depending on the level of sulfur present and severity of the environment, improved devices such as device 10 can retain approximately 100% of their initial brightness value.

Various devices, for example, SMD type devices shown and described herein can comprise a protective barrier or protective layer P. Protective layer P is not limited in application or use, and can be used in devices comprising ceramic, plastic, PCB, MCPCB, or laminate substrates or submounts and can advantageously be applied over multiple surfaces, including LEDs 22 disposed within the SMDs. Protective layer P can at least partially comprise an inorganic material for increasing chemical resistance of the substrate. The inorganic material can comprise an inorganic coating, an inorganic film with an organic or silicone matrix material, and/or an inorganic oxide coating having a thickness ranging from approximately 1 nm to 100 µm. As used herein "inorganic coating(s)", "inorganic layer(s)", "inorganic film(s)" and/or "inorganic oxide coating(s)" can include some organic material or component in the mixture in addition to the inorganic material or component. Such coating(s), layer(s), and/or film(s) as used herein can be mostly inorganic, primarily $SiO_x$ in nature, however, there may generally be some organic component remaining. Any sub-range of protective layer P thickness between approximately 1 nm and 100 μm is also contemplated herein, for example, thicknesses ranging between approximately 1 and 10 nm; 10 nm and 50 nm; 50 nm and 200 nm; 200 nm and 400 nm; 400 and 600 nm; 600 and 800 nm; 800 nm and 1 μm; 1 μm and 5 μm; 5 μm and 10 μm; 10 μm and 50 μm; and 50 μm and 100 μm are contemplated. Protective layer P can also comprise a thickness ranging from approximately 1 nm to 100 nm, 100 nm to 500 nm, and 0.5 μm to 20 μm are also contemplated herein. In one aspect, a thicker protective layer P can provide superior barrier protection of Ag components against harmful chemical complexes C, thereby improving the brightness retention of LED device 10. Protective layer P can be applied via any suitable technique, such as, for example and without limitation, spinning on, dispensing, brushing, painting, dipping, plating, spraying, screen-printing and/or chemical or physical vapor deposition (CVD or PVD) techniques. Of note, however, spinning on, brushing, painting, spraying, etc. may be advantageous, as such techniques can be easier to apply than CVD or PVD processing (e.g., as such techniques do not require a vacuum, require less equipment, and reduce the cost).

In one aspect, protective layer P can comprise a Si-containing inorganic oxide coating. For example, protective layer P can comprise an inorganic oxide coating selected from the group consisting of, but not limited to, organosilicate glass, organosilicate solution, organosilicate dispersion, organosilicate sol-gel, Si-containing spin-on glass (SOG) materials, spin-on polymer materials, and/or spin-on dielectric materials. As noted earlier, and as used herein "inorganic oxide coating(s)" are mostly inorganic, primarily $SiO_x$ in nature, however, there may generally be some organic component remaining hence the "organosilicate" terminology. Precursors of inorganic or inorganic oxide in solution, dispersion, sol-gel, or liquid form can be used to form protective layer P. SOG materials can comprise glasses selected from various product or glass families, such as the silicate family, phosphosilicate family, siloxane family, methylsiloxane family, silsesquioxane family, and dopant-containing variations of these families. Spin-on dielectric materials are mostly delivered in solution form known as flowable oxides. Spin-on materials can be supplied, for example, by suppliers such as Filmtronics, Inc., headquartered in Butler, Pa., Desert Silicon, LLC headquartered in Glendale, Ariz., or Honeywell Electronic Materials having sales offices in North America, Asia, and Europe.

Dopant-containing SOG or spin-on dielectric materials in various delivery forms can also be used to form protective layer P. Notably, the application of SOG materials to components within LED devices can be optimized in terms of adopting novel application methods, curing schedules, and/or curing temperatures. In one aspect, SOG materials can be, but are not limited to application via spin-on techniques. For example, novel methods of applying SOG materials can include dispensing, dipping, painting, screen printing, brushing, and spraying such materials such that they achieve the unexpected result of protecting LED components from undesirable chemical components which can permeate LED devices. Notably, protective layer P can, but does not have to have a uniform thickness. Also of note, SOG materials typically need to be cured at temperatures of greater than approximately 300° C. In some aspects, SOG materials require curing at temperatures greater than approximately 425° C. As LED devices can comprise bodies (e.g., body 12) that are formed from molded plastic which can melt at approximately 300° C. or less, SOG materials can be cured via novel curing schedules including curing at temperatures that are less than approximately 300° C. such that the plastic body is not susceptible to softening and/or melting. In some aspects, protective layer P can comprise SOG materials cured at temperatures of approximately 300° C. or less such as approximately 250° C. or less, approximately 200° C. or less, approximately 150° C. or less, or approximately 100° C. or less.

Such novel curing schedules and temperatures can unexpectedly produce films which do not crack or shrink and which can be useful for protecting the LED device and/or components within the LED device against undesirable chemical components that can permeate the encapsulant of LED devices. The SOG materials described herein can be chosen for use depending on the type of package body or device used (e.g., ceramic based body, molded plastic body, etc.) and optimized cure schedules/temperatures and/or application method can be considered before adopting a given material for protective layer P. Conventional wisdom regarding the manufacture of LED packages or devices conflicts with using SOG materials within and/or over surfaces of such devices, as SOG materials can be difficult to apply, susceptible to cracking and/or shrinking, and can require high curing temperatures. Notably, devices and components herein can unexpectedly incorporate SOG materials which are optimized with respect to application and/or curing techniques and adapted for use in LED devices described herein to provide excellent chemical resistance against undesired chemicals, chemical vapors, or chemical complexes which can tarnish, corrode, or adversely affect components and brightness of LED devices.

Figure 3:
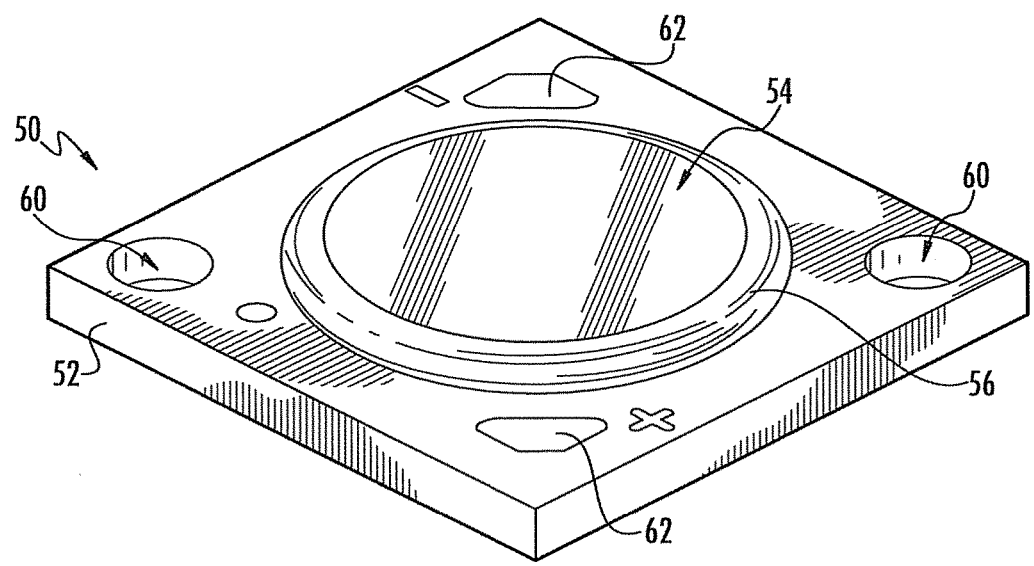
FIG. 3 is a top perspective view of a second embodiment of an LED device according to the disclosure herein.
Figure 4:
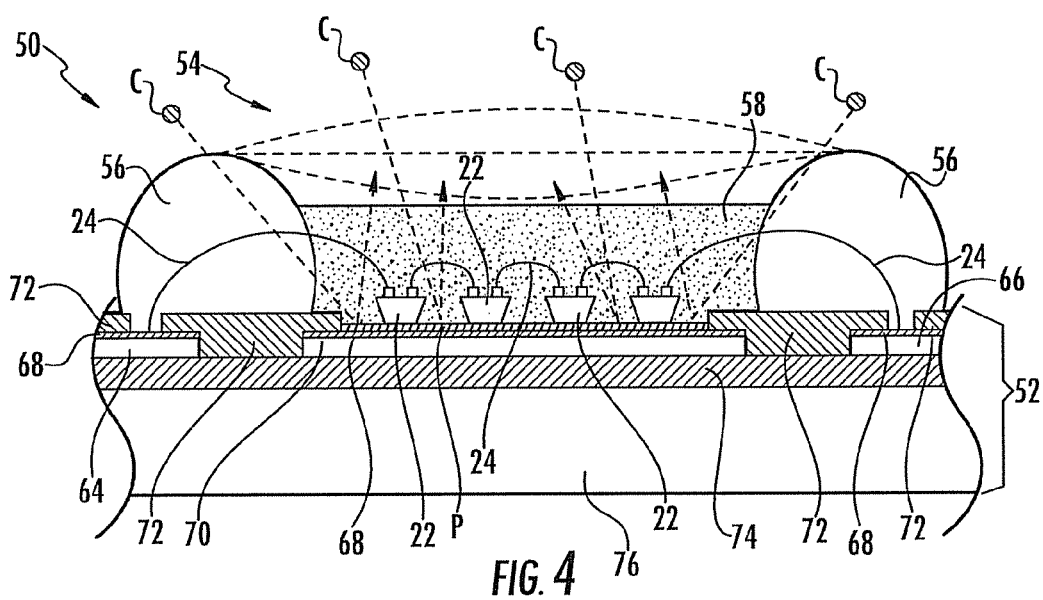
FIG. 4 is a cross-sectional view of the second embodiment of the LED device according to the disclosure herein.

FIGS. 3 and 4 illustrate top perspective and cross-sectional views of another embodiment of an LED package or device, generally designated 50. LED device 50 can also be optimized for chemical resistance by incorporating a protective layer P, for example, on an external surface of device 50 and/or on internal surfaces of device (FIG. 4). LED device 50 can comprise an SMD type device, similar to device 10 in that a secondary optics is not used. Thus, the possibility of degradation of device components exists where undesirable chemical vapors or complexes C permeate the filling material of the device (FIG. 4). LED device 50 can comprise a submount 52 over which an emission area, generally designated 54, can be disposed. Emission area 54 can comprise one or more LEDs 22 disposed under a filling material, such as an encapsulant 58 (see FIG. 4). In one aspect, emission area 54 can be substantially centrally disposed with respect to submount 52 of LED device 50. In the alternative, emission area 54 can be disposed at any location over LED device 50, for example, in a corner or adjacent an edge. Any location is contemplated, and more than one emission area 54 is also contemplated. For illustration purposes, a single, circular emission area 54 is shown; however, the number, size, shape, and/or location of emission area 54 can change subject to the discretion of LED device consumers, manufacturers, and/or designers. Emission area 54 can comprise any suitable shape such as a substantially circular, square, oval, rectangular, diamond, irregular, regular, or asymmetrical shape. LED device 50 can further comprise a retention material 56 at least partially disposed about emission area 54 where retention material 56 can be referred to as a dam. Retention material 56 can comprise any material such as a silicone, ceramic, thermoplastic, and/or thermosetting polymer material. In one aspect, retention material 56 is adapted for dispensing about emission area 54, which is advantageous as it is easy to apply and easy to obtain any desired size and/or shape.

Submount 52 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LEDs may mount and/or attach. LEDs 22 disposed in emission area 54 can electrically and/or thermally communicate with electrical elements disposed with submount 52, for example, conductive traces (FIG. 4). Emission area 54 can comprise a plurality of LED chips, or LEDs 22 disposed within and/or below a filling material 58 such as illustrated in FIG. 4. LEDs 22 can comprise any suitable size and/or shape of chip and can be vertically structured (e.g., electrical contacts on opposing sides) and/or horizontally structured (e.g., contacts on the same side or surface). LEDs 22 can comprise any style of chip for example, straight cut and/or bevel cut chips, a sapphire, SiC, or GaN growth substrate or no substrate. One or more LEDs 22 can form a multi-chip array of LEDs 22 electrically connected to each other and/or electrically conductive traces in combinations of series and parallel configurations. In one aspect, LEDs 22 can be arranged in one or more strings of LEDs, where each string can comprise more than one LED electrically connected in series. Strings of LEDs 22 can be electrically connected in parallel to other strings of LEDs 22. Strings of LEDs 22 can be arranged in one or more pattern (not shown). LEDs 22 can be electrically connected to other LEDs in series, parallel, and/or combinations of series and parallel arrangements depending upon the application.

Referring to FIG. 3, LED device 50 can further comprise at least one opening or hole, generally designated 60, that can be disposed through or at least partially through submount 52 for facilitating attachment of LED device 50 to an external substrate, circuit, or surface. For example, one or more screws can be inserted through the at least one hole 60 for securing device 50 to another member, structure, or substrate. LED device 50 can also comprise one or more electrical attachment surfaces 62. In one aspect, attachment surfaces 62 comprise electrical contacts such as solder contacts or connectors. Attachment surfaces 62 can be any suitable configuration, size, shape and/or location and can comprise positive and negative electrode terminals, denoted by the "+" and/or "−" signs on respective sides of device 50, through which an electrical current or signal can pass when connected to an external power source.

One or more external electrically conductive wires (not shown) can be physically and electrically attached to attachment surfaces 62 via welding, soldering, clamping, crimpling, inserting, or using any other suitable gas-tight solder free attachment method known in the art. That is, in some aspects, attachment surfaces 62 can comprise devices configured to clamp, crimp, or otherwise attached to external wires (not shown). Electrical current or signal can pass into LED device 50 from the external wires electrically connected to device 10 at the attachment surfaces 62. Electrical current can flow into the emission area 54 to facilitate light output from the LED chips disposed therein. Attachment surfaces 62 can electrically communicate with LEDs 22 of emission area 54 via conductive traces 64 and 66 (FIG. 4). That is, in one aspect attachment surfaces 62 can comprise a same layer of material as first and second conductive traces 64 and 66 (FIG. 4) and therefore can electrically communicate to LEDs 22 attached to traces 64 and 66 via electrical connectors such as wire bonds 24. Electrical connectors can comprise wire bonds 24 or other suitable members for electrically connecting LEDs 22 to first and second conductive traces 64 and 66 (FIG. 4).

As shown in FIG. 4, a filling material 58 can be disposed between inner walls of retention material 56. Filling material 58 can comprise an encapsulant that can include a predetermined, or selective, amount of one or more phosphors and/or lumiphors in an amount suitable for any desired light emission, for example, suitable for white light conversion or any given color temperature or color point. Alternatively, no phosphors may be included in filling material 58. Filling material 58 can comprise a silicon encapsulant material, such as a methyl and/or phenyl silicone material. Filling material 58 can interact with light emitted from the plurality of LEDs 22 such that a perceived white light, or any suitable and/or desirable wavelength of light, can be observed. Any suitable combination of encapsulant and/or phosphors can be used, and combinations of differently colored phosphors and/or LEDs 22 can be used for producing any desired color points(s) of light. Retention material 56 can be adapted for dispensing, positioning, damming, or placing, about at least a portion of emission area 54. After placement of retention material 56, filling material 58 can be selectively filled to any suitable level within the space disposed between one or more inner walls of retention material 56. For example, filling material 58 can be filled to a level equal to the height of retention material 56 or to any level above or below retention material 56, for example, as indicated by the broken lines terminating at retention material 56 shown in FIG. 4. The level of filling material 58 can be planar or curved in any suitable manner, such as concave or convex (e.g., see broken lines in FIG. 4).

FIG. 4 illustrates retention material 56 dispensed or otherwise placed over submount 52 after wire bonding the one or more LEDs 22 such that retention material 56 is disposed over and at least partially covers at least a portion of the wire bonds 24. For example, wire bonds 24 of the outermost edge LEDs in a given set or string of LEDs 22 can be disposed within retention material 14. For illustration purposes, only four LEDs 22 are illustrated and are shown as electrically connected in series via wire bonds 24, however, device can contain many strings of LEDs 22 of any number, for example, less than four or more than four LEDs 22 can be electrically connected in series, parallel, and/or combinations of series and parallel arrangements. Strings of LEDs 22 can comprise diodes of the same and/or different colors, or wavelength bins, and different colors of phosphors can be used in the filling material 58 disposed over LEDS 22 that are the same or different colors in order to achieve emitted light of a desired color temperature or color point. LEDs 22 can attach to conductive pad 70 or intervening layers (e.g., layers 68 and/or protective layer P, described below) disposed between LED 22 and conductive pad 70 using any die attach technique or materials as known in art and mentioned above, for example epoxy or metal-to-metal die attach techniques and materials.

LEDs 22 can be arranged, disposed, or mounted over an electrically and/or thermally conductive pad 70. Conductive pad 70 can be electrically and/or thermally conductive and can comprise any suitable electrically and/or thermally conducting material. In one aspect, conductive pad 70 comprises a layer of Cu or a Cu substrate. LEDs 22 can be electrically connected to first and second conductive traces 64 and 66. One of first and second conductive traces 64 and 66 can comprise an anode and the other a cathode. Conductive traces 64 and 66 can also comprise a layer of electrically conductive Cu or Cu substrate. In one aspect, conductive pad 70 and traces 64 and 66 can comprise the same Cu substrate from which traces 64 and 66 have been singulated or separated from pad 70 via etching or other removal method. After etching, an electrically insulating solder mask 72 can be applied such that it is at least partially disposed between conductive pad 70 and respective conductive traces 64 and 66. Solder mask 72 can comprise a white material for reflecting light from LED device 50. One or more layers of material can be disposed between LEDs 22 and conductive pad 70. Similarly, one or more layers of material can be disposed over conductive traces 64 and 66. For example and in one aspect, a first intervening layer or substrate of material 68 can be disposed between LEDs 22 and conductive pad 70 and disposed over traces 64 and 66. First layer of material 68 can comprise a layer of reflective Ag or Ag-alloy material for maximizing brightness of light emitted from LED device 50. That is, first layer of material 68 can comprise a Ag or Ag-containing substrate adapted to increase brightness of device 50. One or more additional layers of material (not shown) can be disposed between first layer 68 and conductive pad 70 and/or first layer 68 and traces 64 and 66, for example, a layer of Ni can be disposed therebetween for providing a barrier between the Cu of pad and traces 70, 64, and 66 and the Ag of layer 68.

Notably, a protective layer P can be at least partially disposed over and/or adjacent to Ag components within device 50, for example, over first layer 68 of material which can coat conductive pad 70 and traces 64 and 68. Protective layer P can provide a barrier over the Ag coated components thereby preventing such components from being physically or electrically degraded via tarnishing, oxidizing, corroding, or other degrading phenomenon caused when harmful chemical, vaporous, or atmospheric complexes C permeate filling material 58. As described earlier, complexes C such as sulfur, sulfides, sulfates, chlorine complexes, bromine complexes, $NO_R$, oxygen, and/or moisture can damage Ag coatings or Ag coated components, such as layer 68 which can coat Cu components including pad 70 and/or traces 64 and 66. As described earlier, protective layer P can comprise an inorganic coating or inorganic oxide coating such as a Si-containing inorganic oxide layer which can repel or prevent complexes C from reaching vulnerable components within LED device 50 as shown by the broken lines and arrows. As previously described, protective layer P can comprise an inorganic coating or inorganic oxide coating selected from the group consisting of, but not limited to, organosilicate glass, organosilicate solution, organosilicate dispersion, organosilicate sol-gel, Si-containing spin-on glass (SOG) materials, spin-on polymer materials, and/or spin-on dielectric materials. Protective layer P can comprise SOG materials optimized by implementing novel application and/or curing techniques. That is, SOG materials can be, but do not have to be applied by spin-on techniques. SOG materials can also be applied via novel application methods such as dispensing, dipping, painting, screen printing, brushing, and spraying such materials which achieve the unexpected result of protecting LED components within device 50 from undesirable chemical components or complexes C capable of permeating LED device 50 without cracking and/or shrinking, and while maintaining good adhesion within device 50. Also of note, SOG materials can be cured via novel curing schedules including curing at temperatures that are less than approximately 300° C. such that LED device 50 and/or components within LED device 50 (e.g., retention material 56 or encapsulant) are not damaged by the curing temperature.

FIG. 4 further illustrates a cross-section of submount 52 over which LEDs 22 can be mounted or otherwise arranged. Submount 52 can comprise, for example, conductive pad 70, first and second conductive traces 64 and 66, and solder mask 72 at least partially disposed between conductive pad 70 and each of conductive traces 64 and/or 66. Conductive traces 64, 66 and conductive pad 70 can be coated with a first layer 68, for example Ag. Protective layer P can be disposed over Ag as shown, or similar to any of the embodiments illustrated in FIGS. 5 to 13. Submount 52 can further comprise a dielectric layer 74, and a core layer 76. Solder mask 72 can directly adhere to portions of dielectric layer 74. For illustration purposes, submount 52 can comprise a MCPCB, for example, those available and manufactured by The Bergquist Company of Chanhassan, Minn. Any suitable submount 52 can be used, however. Core layer 76 can comprise a conductive metal layer, for example copper or aluminum. Dielectric layer 74 can comprise an electrically insulating but thermally conductive material to assist with heat dissipation through submount 52.

As noted earlier, device 50 can comprise a package which does not require or use any secondary optics to keep harmful elements from degrading conductive pad 70. Notably, devices, components and methods disclosed herein provide for improved or optimized chemical resistance and improved chemical properties where zero or minimum loss of brightness occurs, even in the presence of harmful chemicals and can be applicable to any SMD type device or multi-array device disclosed herein. Such improvements can prevent Ag coated components from tarnishing, darkening, corroding, or otherwise degrading.

As described earlier, protective layer P can least partially comprise an inorganic material for increasing chemical resistance of the substrate. Such inorganic material of protective layer P can comprise an inorganic coating, an inorganic film with an organic matrix material, and/or an inorganic oxide coating having a thickness ranging from approximately 1 nm to 100 µm. Any sub-range of protective layer P thickness between approximately 1 nm and 100 µm is also contemplated herein, for example, thicknesses ranging between approximately 10 nm and 50 nm; 50 nm and 200 nm; 200 nm and 400 nm; 400 and 600 nm; 600 and 800 nm; 800 nm and 1 µm; 1 µm and 5 µm; 5 µm and 10 µm; 10 µm and 50 µm; and 50 µm and 100 µm are contemplated. Protective layer P can also comprise a thickness ranging from approximately 1 nm to 100 nm, 100 nm to 500 nm, and 0.5 µm to 20 µm are also contemplated herein.

Of note, one or more additional processing techniques or steps can optionally be performed during manufacture of devices described herein for improving adhesion between one or more layers within the devices. Such optionally processing steps can be used and applied to devices previously shown and described, as well as those in FIGS. 5 through 13 described hereinbelow. For example, such optional techniques can be performed to one or more surfaces prior to deposition or application of one or more adjacent surfaces within a device. Techniques and/or optional processing steps can be performed on surfaces or layers, such as, for example and without limitation, Cu surfaces (e.g., inner portion 30 of elements 14, 16, and/or 18 of device 10 and/or surfaces of conductive pad 70, traces 64 and 66 of device 50), Ag surfaces (e.g., outer portion 32 of elements 14, 16, and/or 18 of device 10, layer of material 68 of device 50), and/or surfaces of protective layer P. In one aspect, one or more of these surfaces can be physically, chemically, or thermally prepared or treated to improve adhesion between the treated surface and adjacent surface(s) or adjacent layer(s). Optional processing steps that are physical in nature can comprise, for example and without limitation, sandblasting, plasma etching, brushing, lapping, sanding, burnishing, grinding, and/or any suitable form of surface roughening (e.g., physically texturizing the surface) to improve adhesion between one or more layers or surfaces within devices shown and described herein. Optional processing steps that are chemical in nature can comprise, for example and without limitation, chemical etching, applying solvents, applying organic solvents, applying acids, applying bases, vapor degreasing, priming, or any suitable chemically process for treating a surface to improve adhesion between one or more layers or surfaces within devices shown and described herein. Optional thermal processing steps can comprise, without limitation, prebaking, preheating, or any suitable thermal treatment that improves adhesion between one or more layers or surfaces within devices shown and described herein.

FIGS. 5 to 13 are cross-sections of previously described LED device 10 which illustrate various locations or placement of protective layer P within and/or over different surfaces of device 10. The location of protective layer P shown and described in FIGS. 5 to 13 are equally applicable to device 50 (FIGS. 3 and 4) as well as any other LED component or embodiment (e.g., downset see FIG. 13, through-hole, TV backlighting downset component), however, for illustration purposes only device 10 has been illustrated in such numerous embodiments. At least one protective layer P can be used within the LED device for improving chemical resistance of the device by providing a barrier of protection against chemical complexes C (FIGS. 2, 4). In one aspect, protective layer P can prevent Ag components from tarnishing, corroding, darkening and/or degrading thereby retaining brightness and optical properties of LED device even in the presence of complexes C (FIGS. 2, 4). FIGS. 5 to 13 illustrate a protective coating or layer P which can be applied directly and/or indirectly over the Ag coated thermal and electrical components 14 and 16, 18 at different locations with respect to device components and/or at different stages of production of device 10. The placement of protective layer P can be dictated by the order of processing steps. For example, if the LED chip 22 or wire bonds 24 are installed before protective layer P is applied, protective layer P will usually coat the LED chips 22 and wire bonds as well as the Ag surface. Other processing steps may involve the masking or removal of protective layer P. All processing sequences and therefore placements of protective layer P are contemplated and are not limited to such exemplary sequences and/or locations as described herein.

Figure 8:
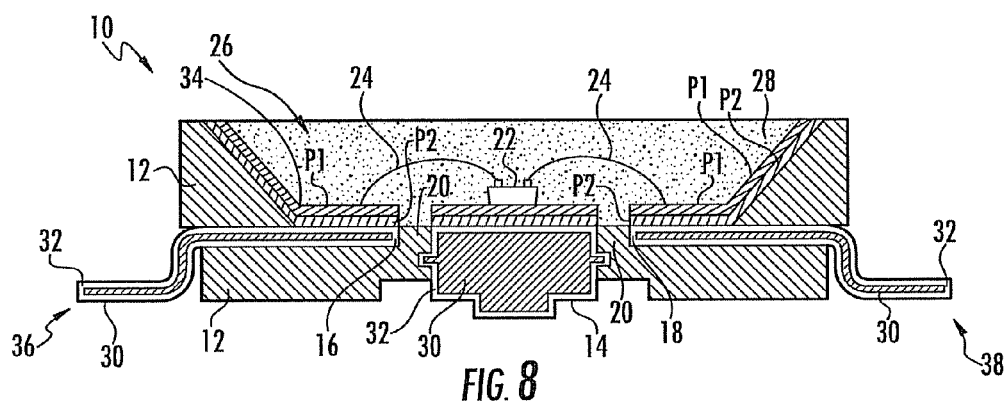

Two or more protective layers, for example, a first and a second protective layer, P1 and P2, respectively, can be used within device 10 for protecting against harmful chemical complexes which may permeate device 10 and degrade components of device 10 (See FIG. 8). Initially of note, and for illustration purposes only, the number of protective layers shown herein may be limited to two, however, any suitable number of protective layers can be applied at any step in the production process and/or at any location within device 10, and such application steps and/or locations are contemplated herein. As described earlier, protective layer P (and/or P1 and P2, FIG. 8) can at least partially comprise inorganic material such as an inorganic coating, an inorganic film with an organic matrix material, and/or an inorganic oxide coating having a thickness ranging from approximately 1 nm to 100 µm. Any sub-range of thickness between approximately 1 nm and 100 µm is contemplated. Protective layer P can be delivered and/or applied in any form to device 10, such as but not limited to application of a solution, dispersion, sol-gel, SOC material (e.g., in solution form), spin-on polymer material, spin-on dielectric material (e.g., as a flowable oxide) or combinations thereof. Protection layer P can provide protection against undesired chemicals, chemical vapors, and chemical complexes C (FIGS. 2, 4) serving as an anti-oxidation, anti-corrosion layer over Ag and Cu, and substrates containing such metals.

Figure 5:
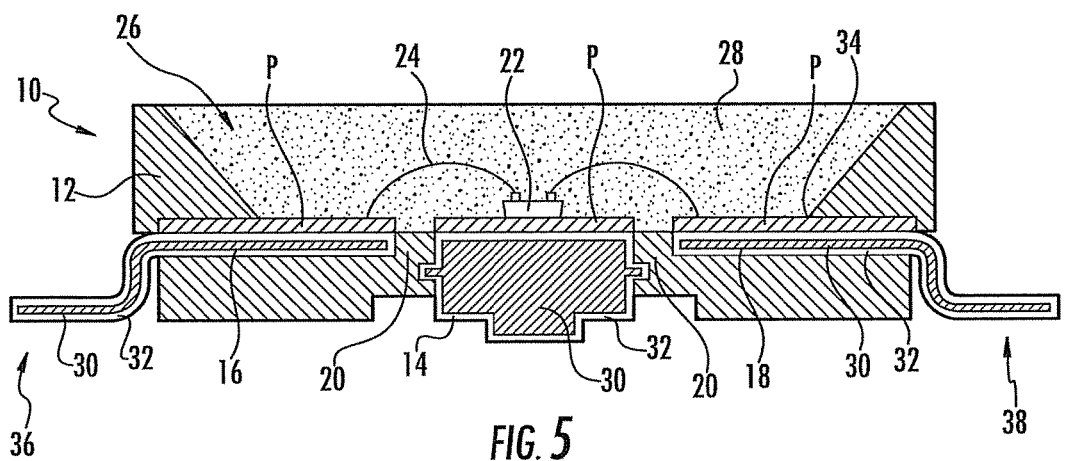
FIGS. 5 through 13 are cross-sectional views of LED devices according to the disclosure herein.

As FIG. 5 illustrates, protective layer P can be applied, deposited, or otherwise disposed over electrical and thermal elements 16, 18, and 14 before the processing step of molding the device body 12 about the leadframe components. That is, protective layer P can extend to a location at least partially within a portion of the molded plastic body 12 such that it contacts one or more surfaces of body 12. In one aspect, protective layer P can be disposed between one or more portions of body 12 as illustrated. Protective layer P can also be disposed between LED 22 and outer portion 32 of thermal element 14. As previously described, outer portion 32 can comprise a layer of Ag (or Ag-alloy coating or plating) over which protective layer P can provide a protective barrier for protecting against complexes which can tarnish, oxidize, or corrode the Ag. Protective layer P can retain optical properties (e.g., brightness) of device 10 despite exposure to undesired chemical complexes which may permeate the device. Protective layer P may also optionally be applied such that it fully extends over floor 34 of cavity 26 and within portions of body 12 such that layer P extends over isolating portions 20 of body as well as Ag coated components (e.g., over outer portions 32 of elements 14, 16, and 18).

Figure 6:
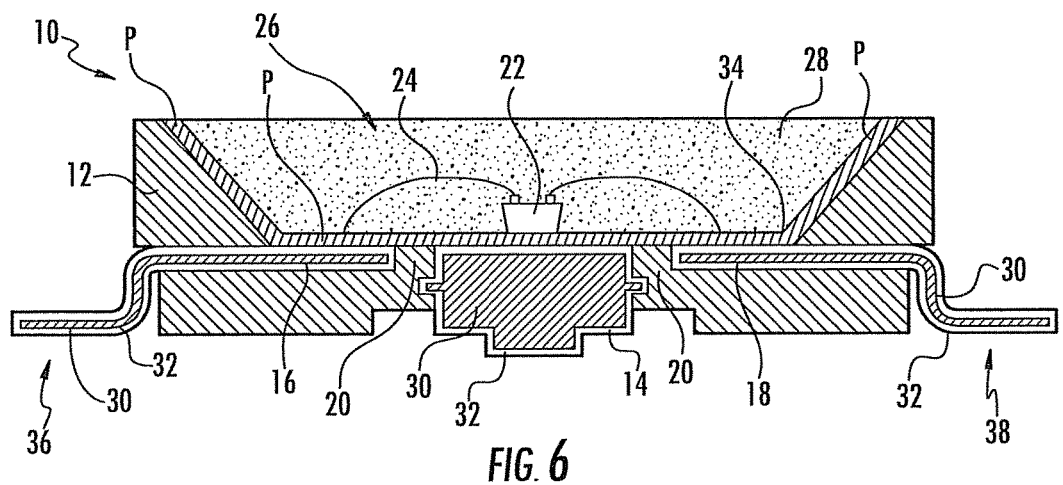

FIG. 6 illustrates an embodiment of device 10 where protective layer P has been deposited after the processing step of molding the body 12, but prior to the LED die attach step, wire bonding step, and/or application of encapsulant 28 step. Thus, protective layer P can extend to a location within device 10 that is below LED 22 and along at least a portion of cavity floor 34. Protective layer P can extend between upper surfaces of thermal element 14 and LED 22. In one aspect, protective layer P can be disposed over the entire surface of cavity floor 34, thus, disposed over surfaces of each of thermal and electrical elements 14, 16, and 18 and isolating portions 20 of body 12. In a further aspect, protective layer P can optionally extend along one or more side walls of reflector cavity 26 as indicated. In addition, since wire bonding to an inorganic protective layer P may be difficult, additional processing steps such as masking and/or etching protective layer P may be employed and are contemplated herein.

Figure 7:
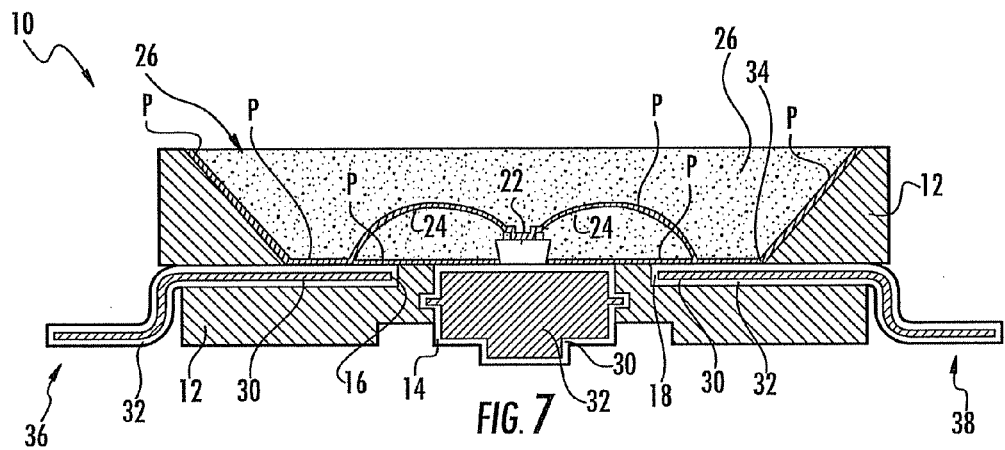

FIG. 7 illustrates an embodiment of device 10 where protective layer P can be applied after the processing step of wire bonding but before the processing step of application of encapsulant 28. In one aspect, protective layer P can at least partially coat surfaces of wire bonds 24, LED 22, walls of cavity 26, cavity floor 34, and surfaces of thermal element 14 and electrical elements 16 and 18 (e.g., outer portions 32 of elements 14, 16, and 18).

FIG. 8 illustrates an embodiment where more than one protective layer can be applied, for example, a first protective layer P1 and a second protective layer P2. First and second protective layers P1 and P2 can be applied at any processing step during production of LED device 10 (and/or device 50), thereby assuming the placement illustrated and described in any of FIGS. 2, 4, and 5 to 13 (e.g., the only difference being application of more than one protective layer P). Each of first and second protective layers P1 and P2 can comprise inorganic material incorporated into an inorganic coating, inorganic oxide coating, or Si-containing coating as previously described. Protective layers P1 and P2 can comprise any thickness ranging from approximately 1 nm to 100 μm. Thicknesses less than 1 nm and/or greater than 100 μm can also be used, however, where more than one layer is present. First and second layers P1 and P2 can be applied as shown over outer portions 32 of thermal and electrical elements 14, 16, and 18 before die attaching LED 22. First and second layers P1 and P2 can optionally extend up side walls of reflector cavity 26 as shown.

Figure 9:
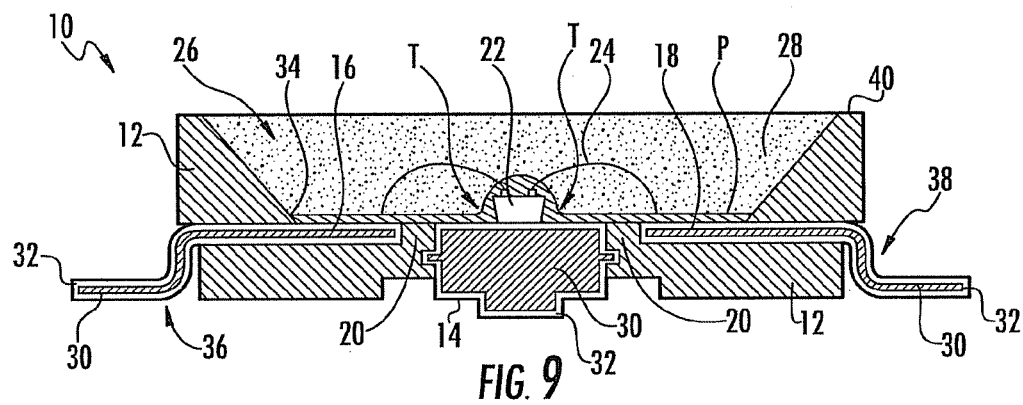

FIG. 9 illustrates another embodiment of device 10, where protective layer P has been applied after the processing step of die attach but before the step of applying encapsulant 28. That is, protective layer P can be located such that it extends about the side and upper surfaces of LED 22, and over portions of wire bond 24, where wire bond 24 attaches to LED 22 (e.g., at wire bond ball). Protective layer P can also be disposed entirely over floor 34 of cavity over outer portions 32 of elements 14, 16, and 18 as well as isolating portions 20 of body 12. Protective layer P can optionally extend up side walls of cavity 26. Notably, protective layer P can, but does not need to comprise a uniform thickness. For example, wetting properties of layer P tend to create thicker areas, or fillets around features within LED device 10. For example, layer P may be thicker in areas T surrounding LED 22 as indicated. Thinner areas of protective layer P are also contemplated.

Figure 10:
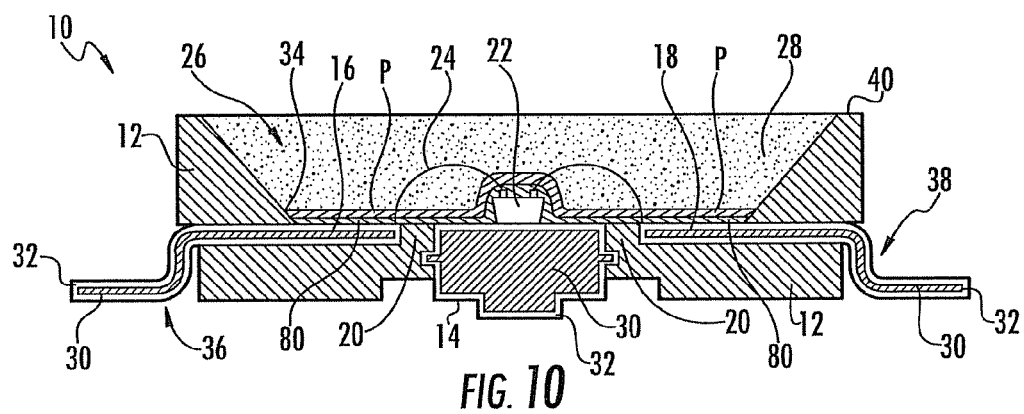

FIG. 10 illustrates an embodiment of device 10 where protective layer P has been applied after die attachment of LED 22 but prior to application of encapsulant 28. As FIG. 10 illustrates, protective layer P can be located and applied subsequently over a first layer 80. First layer 80 can comprise any type of coating or layer, for example, an adhesion coating or layer, a light-affecting coating or layer, or another protective barrier coating or layer such as an inorganic coating or oxide. In one aspect, first layer 80 comprises a layer of light-affecting material such as a layer of encapsulant containing phosphor material that emits light of a desired color point when activated by light from the LED 22. First layer 80 can be disposed between portions of LED 22 and protective layer P, between outer portions 32 of elements 14, 16, and 18 and protective layer P, and/or between isolating portions 20 of body 12 and protective layer P. In an alternative embodiment, LED chip 22 can comprise a horizontally structured (i.e., both contacts on the same side, a bottom side) chip that is directly attached (e.g., no wire bonds) to electrical elements 16 and 18. That is, electrical contacts or bond pads (not shown) disposed on a bottom surface of LED 22 could directly attach to electrical elements 16 and 18 via electrically conductive die attach adhesive (e.g., silicone, epoxy, or conductive silver (Ag) epoxy) such that the electrical contacts of LED 22 electrically communicate directly to elements 16 and 18 without the need for wire bonds 24. First layer 80 can then be applied over LED 22 and can comprise a layer of encapsulant containing phosphor. Protective layer P can then be applied over each of LED chip 22 and first layer 80 as indicated.

Figure 11:
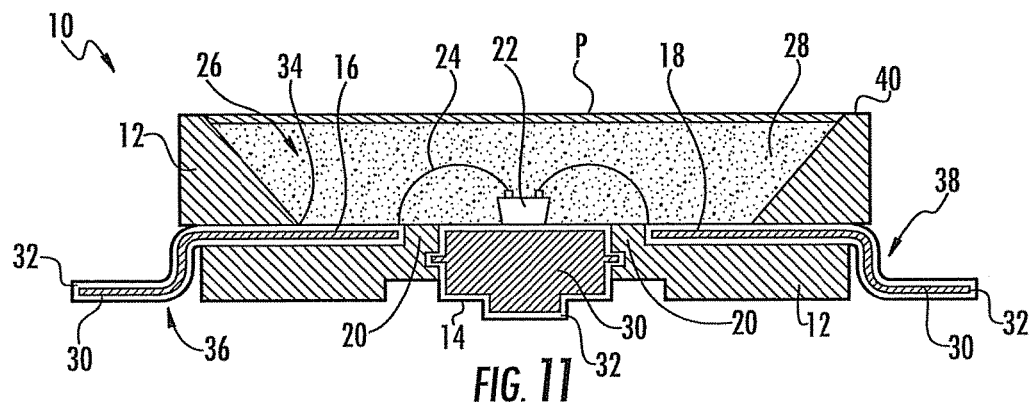
Figure 12:
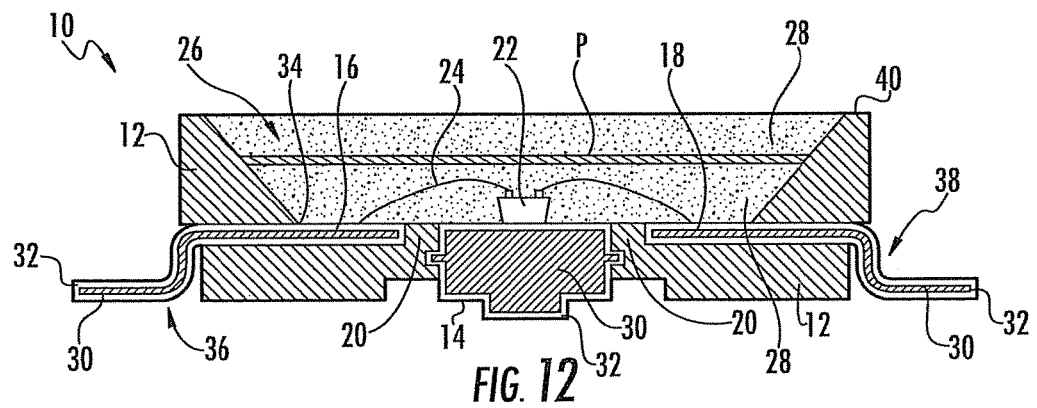

FIGS. 11 and 12 illustrate further embodiments of device 10, where protective layer P has been applied after and/or during the processing step of application (e.g., dispensing) of encapsulant 28. For example, in FIG. 11, protective layer P can be disposed over an upper surface of encapsulant 28. Protective layer P can optionally extend over external surfaces of device 10, for example, over top surface 40 of body 12. Protective layer P can be disposed at a location such that complexes C (FIG. 2) can be repelled before permeating any portion of encapsulant 28. FIG. 12 illustrates protective layer P applied during the processing step of application of encapsulant 28. In this embodiment, protective layer P can be disposed between portions of encapsulant 28, such that undesirable complexes C (FIG. 2) can be prevented from reaching Ag coated components (e.g., outer portion 32 of elements 14, 16, and 18) thereby preventing any potential damage, corrosion, or darkening that may occur to the Ag components. That is, protective layer P can be disposed between layers or portions of encapsulant 28 or between two or more separate encapsulation steps. This can advantageously allow device 10 to incur approximately zero, or minimal, brightness loss during operation, even in the presence of harmful chemicals, chemical vapors, oxygen, or moisture.

Figure 13:
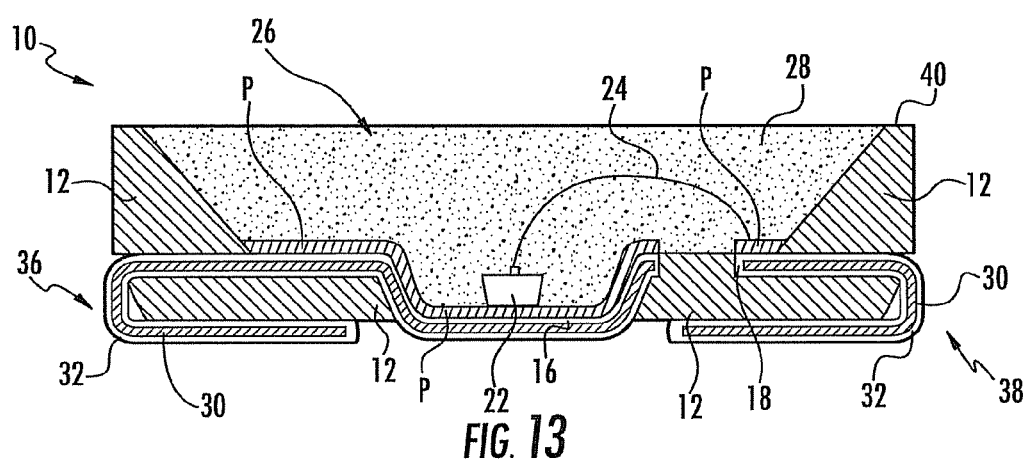

FIG. 13 illustrates a further embodiment of device 10. Device 10 can comprise two electrical elements 16 and 18 to which LED 22 can electrically connect. Tab portions 36 and 38 can bend inwardly towards each other thereby adapting either a J-bend. In this embodiment, LED 22 can comprise a vertically structured device with a first electrical contact or bond pad on a bottom surface and a second electrical contact or bond pad on the opposing top surface. The first electrical contact can electrically and physically connect with first electrical element 16 via a die attach adhesive (e.g., silicone, flux, solder, epoxy, etc.) and second electrical contact can electrically and physically connect to second electrical element 18 via wire bond 24. In this embodiment, LED device 10 comprises a downset or recessed type of package where LED 22 and/or at least a first electrical element can be on a different plane than other components of the LED package or device (e.g., on a different plane from second electrical element 18). In this embodiment, protective layer P can be applied in any of the locations shown in FIGS. 5-12. For illustrations purposes, protective layer P is shown as applied before attaching and wire bonding LED 22. However, any suitable sequence for placing and/or location of protective layer P is contemplated, for example, along one or more sidewalls of device 10 and/or applied in combination with other layers. Protective layer P can be applied such that it is disposed over a portion of body 12 (e.g., between 16 and 18) and can be subsequently removed as shown via optional masking and/or etching steps if desired.

Embodiments of the present disclosure shown in the drawings and described above are exemplary of numerous embodiments that can be made within the scope of the appended claims. It is contemplated that the configurations of LED devices optimized for chemical resistance and methods of making the same can comprise numerous configurations other than those specifically disclosed, including combinations of those specifically disclosed.

What is claimed is:
1. A light emitting device comprising:
a substrate having an upper surface and comprising a leadframe, the leadframe comprising a thermal element and one or more electrical elements, wherein the thermal element and the one or more electrical elements comprise a silver containing material, wherein the silver containing material comprises silver and/or a silver alloy, wherein the thermal element is electrically and/or thermally isolated from the one or more electrical elements;
one or more light emitting diodes (LEDs) disposed on the upper surface of the substrate;

a first protective layer disposed on and covering all of the upper surface of the substrate, the first protective layer at least partially comprising an inorganic material for increasing chemical resistance of the silver-containing material of the thermal element of the substrate and/or the one or more electrical elements of the substrate, wherein the inorganic material contains some organic component, and wherein the first protective layer comprises a substantially uniform thickness; and a filling material disposed on portions of the one or more LEDs and on portions of the first protective layer, wherein the filling material contains a phosphor material disposed therein, wherein the leadframe, comprising the thermal element and the one or more electrical elements, comprises a material that is electrically and/or thermally conductive.

2. The device of claim 1, wherein the first protective layer at least partially comprises a silicon containing material selected from the group consisting of an organosilicate glass, organosilicate solution, organosilicate dispersion, organosilicate sol-gel, a Si-containing spin-on glass material, a spin-on polymer material, and a spin-on dielectric material.

3. The device of claim 2, wherein the spin-on glass material comprises a glass family selected from the group consisting of a silicate family, a phosphosilicate family, a siloxane family, a methylsiloxane family, a silsesquioxane family, and a dopant-containing variation of one of these families.

4. The device of claim 1, wherein the first protective layer comprises a thickness from approximately 50 nm to approximately 100 μm.

5. The device of claim 4, wherein the first protective layer comprises a thickness from approximately 50 nm to approximately 100 nm.

6. The device of claim 4, wherein the first protective layer comprises a thickness from approximately 100 nm to approximately 500 nm.

7. The device of claim 4, wherein the first protective layer comprises a thickness from approximately 0.5 μm to approximately 20 μm.

8. The device of claim 4, wherein the first protective layer is directly disposed over the substrate.

9. The device of claim 1, wherein a first LED is at least partially disposed between portions of the first protective layer and the substrate.

10. The device of claim 1, wherein the filling material is disposed on portions of the substrate.

11. The device of claim 1, wherein a second protective layer is disposed on the first protective layer.

12. The device of claim 1, wherein a second protective layer is disposed at least partially between portions of the first protective layer and portions of the filling material.

13. The component of claim 1, wherein a layer of material is disposed between the first protective layer and the substrate.

14. The device of claim 1, further comprising two or more LEDs.

15. The device of claim 1, further comprising first and second protective layers disposed over the substrate, wherein each protective layer comprises the inorganic material.

16. The component of claim 1, wherein the one or more LEDs emit a same color of light.

17. The device of claim 1, wherein the substrate is contained within a molded plastic body.

18. The device of claim 1, wherein the substrate is a layer of a submount of the device, wherein the layer is covered by the first protective layer.

19. The device of claim 1, wherein the substrate is contained within a ceramic body.

20. A light emitting device comprising:

a substrate having an upper surface and comprising a leadframe, the leadframe comprising a thermal element and one or more electrical elements, wherein the thermal element and the one or more electrical elements comprise a silver containing material, wherein the silver containing material comprises silver and/or a silver alloy, wherein the thermal element is electrically and/or thermally isolated from the one or more electrical elements;

one or more light emitting diodes (LEDs) disposed on the upper surface of the substrate;

a first protective layer disposed on and covering all of the upper surface of the substrate, wherein the first protective layer comprises a substantially uniform thickness; and a layer of filling material disposed on the one or more LEDs and on the first protective layer, wherein the filling material contains a phosphor material disposed therein;

wherein the first protective layer prevents gaseous chemicals or airborne elements that have permeated the filling material from interacting with the silver-containing material of the thermal element of the substrate and the one or more electrical elements of the substrate, wherein the leadframe, comprising the thermal element and the one or more electrical elements, comprises a material that is electrically and/or thermally conductive.

21. The device of claim 20, wherein the first protective layer at least partially comprises an inorganic material, and wherein the inorganic material contains some organic component.

22. The device of claim 21, wherein the inorganic material comprises a silicon containing material selected from the group consisting of an organosilicate glass, organosilicate solution, organosilicate dispersion, organosilicate sol-gel, a Si-containing spin-on glass material, a spin-on polymer material, and a spin-on dielectric material.

23. The device of claim 22, wherein the spin-on glass material comprises a glass family selected from the group consisting of a silicate family, a phosphosilicate family, a siloxane family, a methylsiloxane family, a silsesquioxane family, and a dopant-containing variation of one of these families.

24. The device of claim 20, wherein the substrate is at least partially disposed over a copper (Cu) component.

25. The device of claim 24, wherein the substrate is at least partially disposed within a molded plastic body of the device.

26. The device of claim 24, wherein the substrate is at least partially disposed within a ceramic body of the device.

27. The device of claim 24, wherein the substrate is at least partially disposed over a submount of the device, the submount comprising a printed circuit board (PCB), a metal core printed circuit board (MCPCB), or an aluminum panel.

28. The device of claim 20, wherein the filling material comprises a silicone encapsulant having a selective amount of the phosphor material disposed therein.

29. The device of claim 28, wherein the silicone encapsulant comprises a methyl silicone.

30. The device of claim 28, wherein the silicone encapsulant comprises a phenyl silicone.

31. The device of claim 28, wherein a retention material is disposed about the silicone encapsulant.

32. The device of claim 28, wherein the silicone encapsulant is disposed within a cavity of the device.

33. The device of claim 20, wherein the first protective layer comprises a thickness from approximately 50 nm to approximately 100 μm.

34. The device of claim 33, wherein the first protective layer comprises a thickness from approximately 50 nm to approximately 100 nm.

35. The device of claim 33, wherein the first protective layer comprises a thickness from approximately 100 nm to approximately 500 nm.

36. The device of claim 33, wherein the first protective layer comprises a thickness from approximately 0.5 μm approximately 20 μm.

37. The device of claim 20, wherein the first protective layer is directly disposed over and covers the substrate.

38. The device of claim 20, wherein a portion of a first LED is at least partially disposed between portions of the first protective layer and the substrate.

39. The device of claim 20, wherein the filling material is disposed on portions of the substrate.

40. The device of claim 20, wherein a second protective layer is disposed on the first protective layer.

41. The device of claim 20, further comprising two or more LEDs.

42. The device of claim 20, further comprising first and second protective layers disposed over the substrate, wherein each protective layer comprises the inorganic material.

43. The device of claim 20, wherein the one or more LEDs emit a same color of light.

44. The device of claim 1, wherein the thermal element and the one or more electrical elements comprise a silver containing material.

45. The device of claim 20, wherein the thermal element and the one or more electrical elements comprise a silver containing material.

* * * * *